US008532234B2

(12) United States Patent
Maleysson et al.

(10) Patent No.: US 8,532,234 B2
(45) Date of Patent: Sep. 10, 2013

(54) AUTOMATIC FREQUENCY OFFSET COMPENSATION METHOD AND DEVICE

(75) Inventors: Laurent Maleysson, Le Grau du Roi (FR); Fabien Bonjour, Le Cres (FR)

(73) Assignee: Coronis, SAS, Perols (FR)

( * ) Notice: Subject to any disclaimer, the term of this patent is extended or adjusted under 35 U.S.C. 154(b) by 128 days.

(21) Appl. No.: 13/004,276

(22) Filed: Jan. 11, 2011

(65) Prior Publication Data

US 2011/0299639 A1  Dec. 8, 2011

(30) Foreign Application Priority Data

Jan. 11, 2010 (EP) .................................. 10000164

(51) Int. Cl.
*H04L 27/06* (2006.01)

(52) U.S. Cl.
USPC ........... 375/344; 375/327; 375/343; 375/345; 375/346; 375/326; 375/362; 375/340; 370/320; 370/335; 370/342; 370/441; 370/509; 370/510; 370/511; 370/512; 370/513; 370/514

(58) Field of Classification Search
USPC ................. 375/260, 319, 340, 344; 370/203, 370/210, 312
See application file for complete search history.

(56) References Cited

U.S. PATENT DOCUMENTS

| 5,974,098 | A * | 10/1999 | Tsuda | 375/340 |
|---|---|---|---|---|
| 6,208,837 | B1 | 3/2001 | Koh et al. | |
| 6,463,266 | B1 | 10/2002 | Shohara | |
| 7,461,346 | B2 | 12/2008 | Fildebrandt | |
| 7,512,423 | B2 | 3/2009 | Karaoguz | |
| 8,189,697 | B2 * | 5/2012 | Moffatt et al. | 375/260 |
| 2002/0159540 | A1 * | 10/2002 | Chiodini | 375/316 |
| 2002/0176519 | A1 * | 11/2002 | Chiodini et al. | 375/324 |
| 2004/0005022 | A1 * | 1/2004 | Zhu et al. | 375/365 |
| 2005/0135432 | A1 * | 6/2005 | Kelley et al. | 370/532 |
| 2006/0071698 | A1 * | 4/2006 | Parikh | 327/231 |
| 2008/0089443 | A1 * | 4/2008 | Sanada et al. | 375/319 |
| 2008/0292031 | A1 | 11/2008 | Sibers | |
| 2009/0323865 | A1 * | 12/2009 | Bradley et al. | 375/330 |

FOREIGN PATENT DOCUMENTS

| FR | 2836308 | 8/2003 |
|---|---|---|
| WO | WO 97/38489 | 10/1997 |
| WO | WO 98/35544 | 8/1998 |
| WO | WO 02/07387 | 1/2002 |
| WO | WO 2009/095869 | 8/2009 |

* cited by examiner

*Primary Examiner* — Daniel Washburn
*Assistant Examiner* — Eboni Hughes
(74) *Attorney, Agent, or Firm* — Harness, Dickey & Pierce, P.L.C.

(57) ABSTRACT

The disclosure aims to implement an automatic frequency offset compensation of the frequency between emitter and receiver equipments, in radio frequency modules, with a frequency offset that can be larger than that the receiver can allow, without time loss and extra consumption. To solve this problem, the disclosure provides an automatic frequency offset compensation device comprising a reception front end, at least a filter, an I/Q demodulator for obtaining the I (In Phase) and Q (Quadrature) parameter, an automatic frequency control AFC unit for comparison of a received frequency with the real frequency of the equipment, and a microcontroller and a frequency synthesizer. In this device, the frequency offset is calculated by the AFC unit from the information given by the I/Q demodulator. A coarse detection with wide filter can be used for the reception of the first part of the data called preamble signal, and a fine detection with narrow filter can be used for reception of the second part of the data called useful data frame. A frequency synthesis is made using the frequency offset.

15 Claims, 5 Drawing Sheets

AUTOMATIC FREQUENCY OFFSET COMPENSATION METHOD AND DEVICE

CROSS-REFERENCE TO RELATED APPLICATIONS

This application claims the benefit and priority of European Patent Application Serial No. 1000164.3, filed on Jan. 11, 2010, which is incorporated by reference herein.

BACKGROUND AND SUMMARY

The invention relates to an automatic frequency offset compensation method to compensate the frequency offset between transceiver equipments, and to a device to implement such a method.

The technical area is radio communication at specific ranges of frequencies, in particular for applications that need competitive solutions in terms of capacity to control the channels and of low battery consumption. In most of the radio frequency modules, by now, the frequency depends always on the accuracy of a frequency reference (crystal, resonator, ... ).

A PLL (Phase-Locked loop) with a crystal oscillator is generally used. But the accuracy of this module is linked to the accuracy of the crystal. The accuracy depends on three parameters: the batch (initial dispersal at room temperature), temperature and aging. The dispersal is easily cancelled by calibrating the module in production. For the second parameter, temperature compensation can be used,—by using a compensation curve based on a average of the frequency offset for different batch—, but it remains an error, especially at the extreme temperature, which can not be removed before reception.

The effect of the third parameter (aging) cannot be neutralised. So the consequence is that there is always a frequency offset between the transmitter and the receiver. If the frequency offset is too large, the communication becomes impossible. For narrow band device, the allowed frequency offset is low, due to the narrow bandwidth. The narrow bandwidth has the advantage to allow best sensitivity. However, considering a communication device as a whole, a compromise should be found between good sensitivity and large allowed offset width.

One solution should be to implement several receptions at different adjacent sub-channels, over a ranger larger than the receiver bandwidth. This allows covering a wide range even with a narrow bandwidth. But, several receptions increase the consumption for scanning a channel, especially in case of empty channels. The time period for scanning is also increased.

Another solution is the reduction of the frequency offset by using more accurate frequency reference as TCXO (temperature crystal oscillator). The drawbacks of this solution are higher costs and consumption. Thus, the problem is the achievement of a communication between a receiver and a transmitter even with a frequency offset larger than that the receiver can allow, without time loss and extra consumption.

The invention comes from searching a solution to reduce the consumption while keeping a standard crystal and from the observation that the frequency offset could be deduced from demodulation. And, if the frequency offset is known, then compensation can be obtained by appropriate looping of optimised detection. More specifically, the object of the invention is an automatic frequency offset compensation method to compensate the frequency offset of a carrier frequency signal modulated by data between emitter and receiver equipments, characterised in that the method consists in, after signal digitalization and next channel filtering carrying out a demodulation to obtain the I (In Phase) and Q (Quadrature) parameters, calculating the frequency offset from I and Q parameters between received and current frequency of the equipment, and synthesizing corrected frequency based on the calculated offset.

The automatic frequency offset compensation method to compensate the frequency offset of data modulated by carrier frequencies between emitter and receiver equipments. The method consists in, after frequency digitalization and next channel filtering carrying out a frequency demodulation to obtain the I (In Phase) and Q (Quadrature) parameters, calculating the frequency offset from I and Q parameters between received and current frequency of the equipment, and synthesizing corrected frequency based on the calculated offset. The I,Q demodulator allows the offset frequency deduction between the received signal and the current frequency of the receiver. The digitalized frequency is different from the current frequency because of crystal dispersal. The method allows a reduction of time for scanning and so a reduction of the consumption. It allows the use of a standard crystal as frequency reference for the receiver and the transmitter.

With preferred embodiments:

the filtering, comparison and frequency offset calculation loop can operate once but is advantageously repeated at least twice for a better efficiency;

the frequency compensation is optimized by using a coarse detection with a wide filtering, advantageously repeated, for the reception of a preamble signal, the first part of the data, and a fine detection with a narrow filtering for reception of the useful data frame, the remaining part of the data; this effect results from the fact that a frequency coarse detection with a wide filter gives the same reception performances as a frequency fine detection with a narrow filter;

a synchronous mode is used for the fine detection;

an asynchronous mode is used for the coarse detection.

The object of the invention is also a device for automatic offset frequency compensation of the frequency received by a transceiver, comprising the following components:

a frequency receiver,
a filter,
an analog to digital converter,
a channel filter
an I/Q demodulator,
an automatic frequency control (AFC) unit for calculating the resulting offset correction;
a frequency synthesizer to provide the corrected frequency,
a digital unit to control the components.

A transceiver encompasses the equipments that transmit and/or receive data carried on appropriate frequencies in the radio-frequency range.

According to preferred embodiments:

the frequency synthesizer and loop arrangement are provided by a unique Phase Locked Loop (PLL) synthesizer;

the channel filter is a programmable-channel filter to improve the result of the AFC unit;

a register stores the output information of the I/Q demodulator to be provided to the AFC unit;

a digital unit such as a microcontroller controls the AFC unit, the channel filter, the demodulator, and the PLL synthesizer;

an analog to digital conversion of the filtered frequency is achieved by a Sigma Delta ADC Converter;

a bit synchronizer is implemented for the synchronous mode;

the microcontroller is a 8 bit microcontroller.

BRIEF DESCRIPTION OF THE DRAWINGS

In the following, the invention is greater detailed with reference to the attached drawings that represent, respectively.

DETAILED DESCRIPTION

Figure 1:
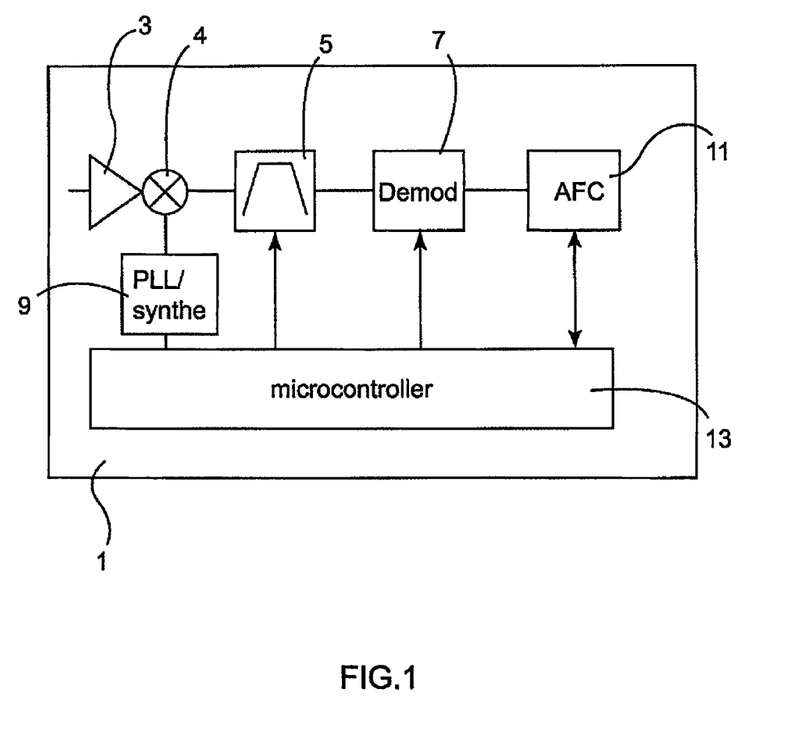
FIG. 1, the main components of the automatic frequency offset compensation device for a receive, according to the invention.

FIG. 1 shows the main components set on a card 1 of an automatic offset frequency compensation device of the invention, adapted to a receiver. A frequency is amplified by a low noise amplifier 3 and down converted to a lower frequency by a mixer 4. Then, the frequency is filtered by a programmable channel filter 5 and is demodulated in an I/Q demodulator 7. An automatic frequency control AFC unit 11 evaluates the frequency offset between the frequency input signal, as filtered and demodulated, and the—current frequency of the receiver. A frequency synthesizer with Phase Locked Loop (PLL) 9 provides the corrected frequency.

A digital unit, as a microcontroller 13, reads this offset, controls the bandwidth of the programmable filter 5, and controls also the frequency of the PLL/frequency synthesizer 9, the I/Q demodulator 7 and of the AFC unit 11. The filtered frequency is converted from analog to digital at the conversion step 19.

Figure 2:
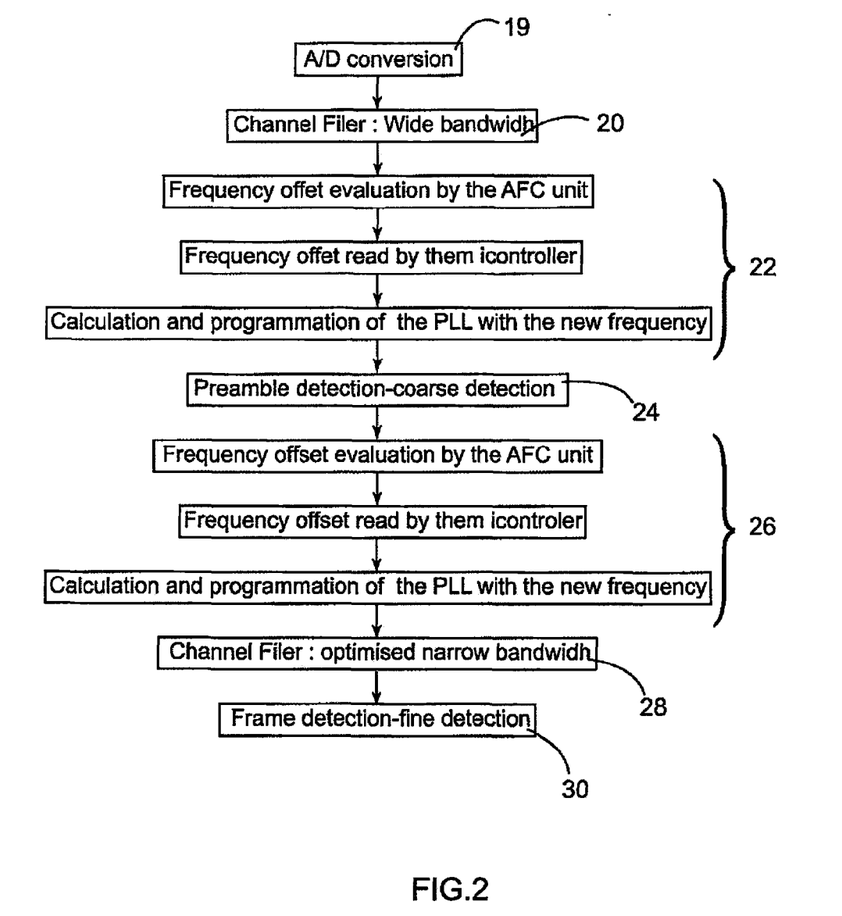
FIG. 2, a flow chart of the automatic frequency offset compensation method for the receiver equipment of FIG. 1.

FIG. 2 shows the flow chart of the automatic frequency control and offset compensation device of FIG. 1. The received frequency is filtered by the channel filter in a filter step 20 with a large bandwidth initially programmed by the microcontroller 13. This filter bandwidth is wider than the necessary input, to optimise a first preamble data detection, as a wide bandwidth allows catching the input signal even if there is a frequency offset.

First frequency compensation steps 22 are achieved for the preamble data, following the steps of frequency coarse evaluation by the AFC unit 11, frequency reading by the microcontroller 13, then offset calculation and PLL/synthesizer 9 programming by the microcontroller 13. Then, a coarse detection of the preamble is performed at step 24. This coarse detection allows optimised sensitivity with a wide filter, i.e. the sensitivity obtained with an optimised filter. A second frequency offset compensation 26 is performed on the preamble data by the following steps of frequency offset fine evaluation by the AFC unit 11, frequency reading by the microcontroller 13, then offset calculation and PLL/synthesizer 9 programming by the microcontroller 13. A corrected frequency is deduced from the offset calculation by the microprocessor and introduced in the PLL/synthesizer.

The Channel filter is then programmed by the microcontroller at a narrower bandwidth at step 28 centred on the corrected frequency. Consequently, the data frame fine detection can begin at step 30 with such a narrow filter that allows optimised sensitivity. Thus, the frequency offset compensation is implemented twice in the process according to this example. Alternatively, it can be implemented more than twice (or only once if desired). The more the number of compensation correction steps, the narrower the range of the bandwidth filter and the better the demodulation of the data frame.

Figure 3:
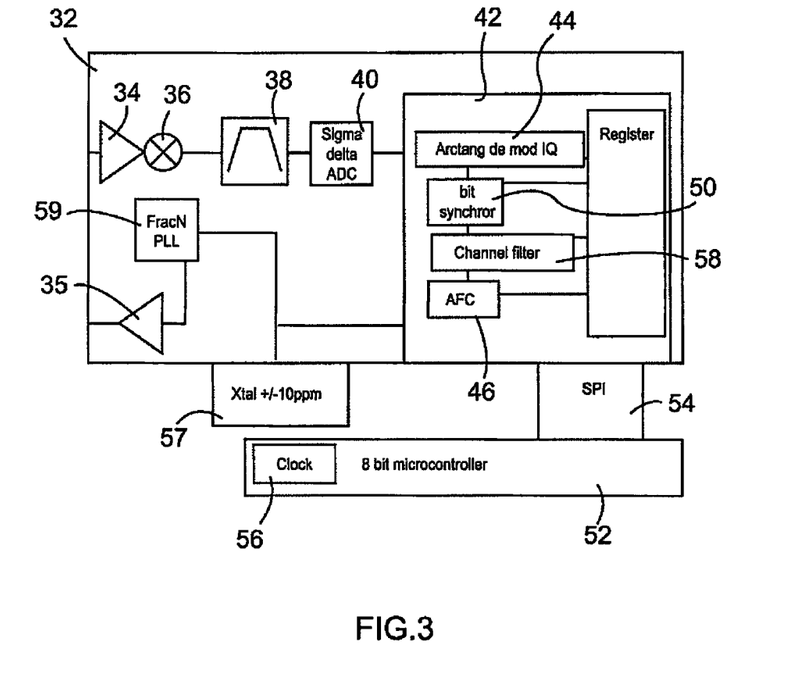
FIG. 3, an example of an automatic frequency offset compensation device for a transmitter/receiver equipment.

The FIG. 3 shows a detailed embodiment of an example of implementation of a device according to the invention in a transceiver. This example is a Radio Frequency transceiver, multi-channel, receiving and transmitting radio frequencies in the ranges 400-480 and 800-960. All components are settled on an ASIC (Application Specific for Integrated Circuit) card 32.

The radio frequency is received by the radio receiver 34, 36, 38, 40, 42 and is emitted by a radio emitter 35. This frequency is down converted to a lower frequency (few hundred kilohertz) in a low nose amplifier LNA-Mixer 36. The PLL/synthesizer 59 provides the frequency signal needed for the receiver and the transmitter. The PLL structure allows the programmation of the frequency.

Thus, the lower frequency is filtered by a fixed complex band path filter 38 and digitally converted by a sigma delta Analog to Decimal Converter 40. The digital signal is then applied to an Arctan I/Q demodulator 44 and to a programmable channel filter 58. The frequency offset is calculated by the AFC module 46 from the Arctan I/Q demodulator 44 information. The AFC module correction is available in a specific memory such as a register 48.

A synchronisation mode is used only for the fine detections, with a bit synchroniser 50 to this end. The bit time is measured by the 8 bit microcontroller 52, cadenced by an internal 4 MHz data clock 56. A digital bloc 42 is settled on the ASIC card 32 and integrates the digital components: channel filter 58, the automatic frequency control AFC module 46, Arctan I/Q demodulator 44, register 48, and the bit synchroniser 50.

The frequency correction is achieved by a new programmation of a FracN (fractional part of integer N) PLL synthesizer 59. The 8 bit microcontroller 52 accesses to the digital bloc 42 by a SPI bus 54. An external Crystal Reference 57 is used by the equipments of the ASIC, mainly the bit synchroniser 50.

The ASIC 32 has two main data modes:

synchronous mode, in which the bit synchroniser 50 recovers the data clock, so the data are synchronised with this clock, and asynchronous mode, in which the bit synchroniser 50 is not used—the raw data are transmitted to the microcontroller without any clock.

The coarse detection is achieved in asynchronous mode, and is applied to the detection of a preamble signal, which corresponds to a first part of the data. The fine detection is performed in synchronous mode, and is applied to detection of the useful data, the remaining part of the data.

Example of Transceiver Configuration:

Frequency ranges: ISM band 433 MHz-868/870 MHz and 902-928 MHz

Received frequency sensitivity: −110 dBm

Output power: 14 dBm

Modulation: type GFSK (Gaussian Frequency Shift Keying) BT=0.5 for the Gaussian filter Baud rate: 19.2 kbds Deviation: 9 kHz Wide channel bandwidth for coarse detection: 60 kHz Narrow channel Bandwidth: 40 kHz Data format: NRZ (Non Zero Reset)

Fractional N PLL Rx; step: 450 Hz

AFC start delay: 1.5 ms

AFC end delay: 800 μs.

Figure 4:
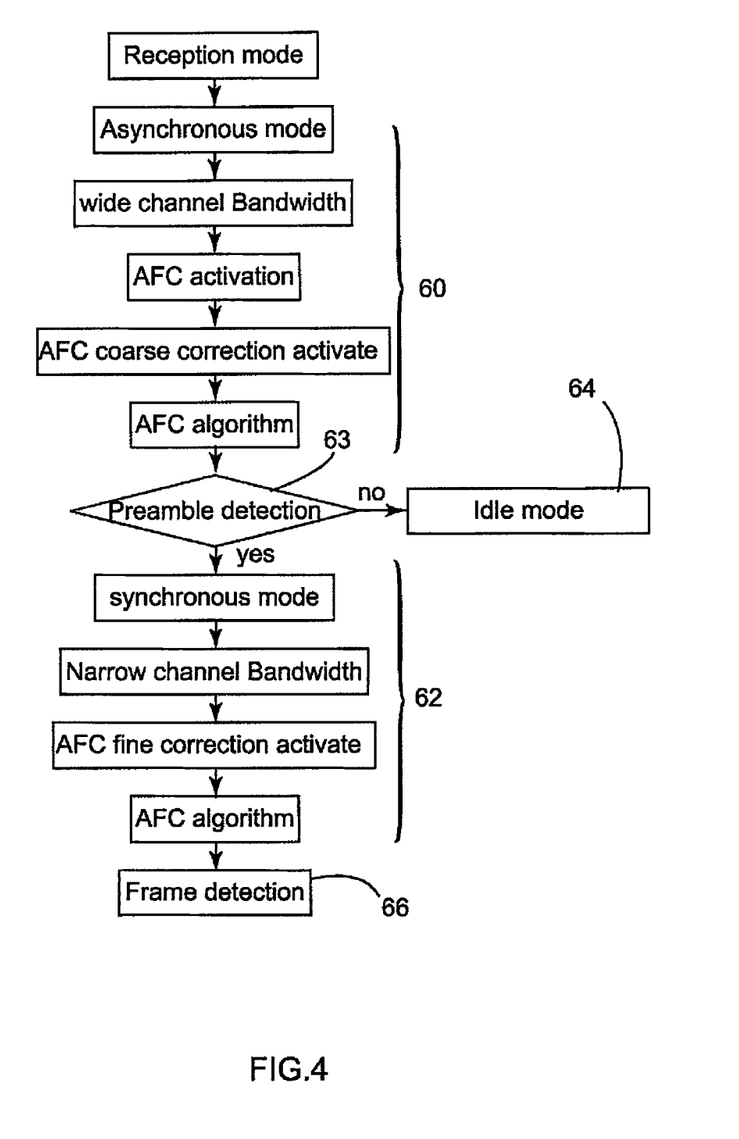
FIG. 4, an example of the microcontroller flowchart process of the example of FIG. 3.
Figure 5:
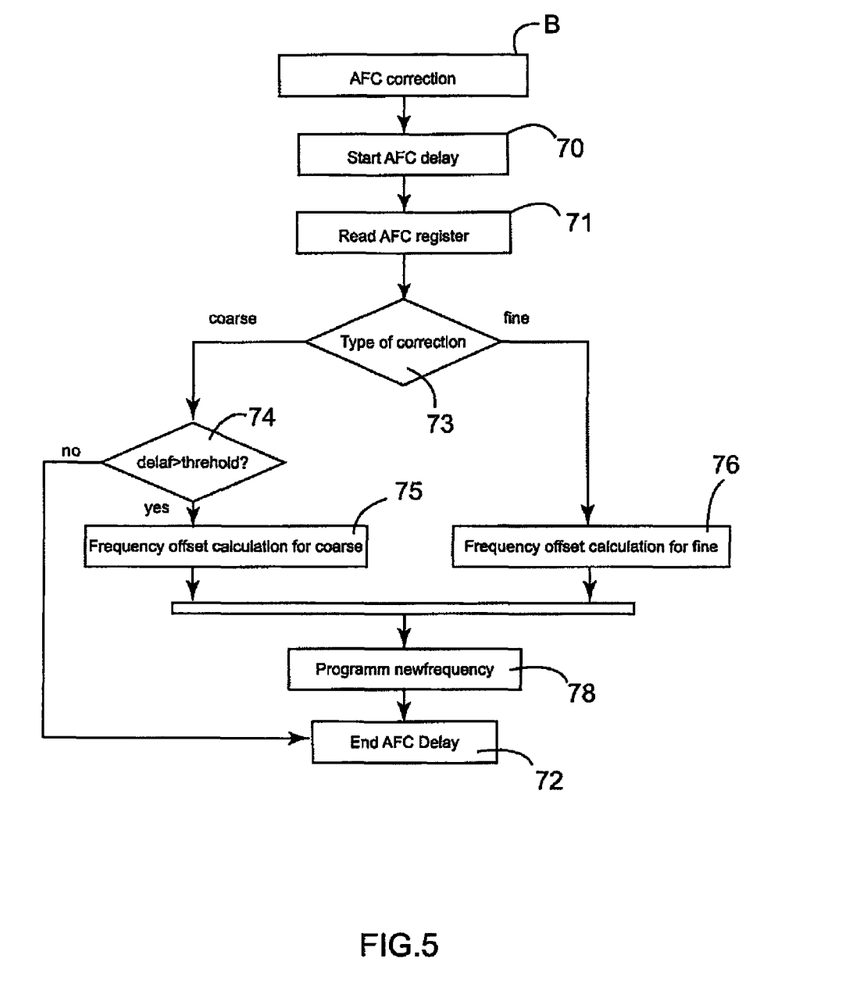
FIG. 5, an example of the AFC flowchart process of the example of FIG. 3.

The FIG. 4 shows a process flowchart of the microcontroller 52 (FIG. 3). The microcontroller process contains the following forwarded steps:

first step A: reception mode chosen by the microcontroller 52.

coarse steps 60: steps for the coarse detection of the preamble data, and contains the steps of applying the asynchronous mode, the wide channel bandwidth on the filter 58 (FIG. 3), the activation of the AFC module 46, the AFC coarse correction, the AFC algorithm, as shown by FIG. 5.

step 63: preamble signal detection.

If the preamble signal is not detected in step 63, the microcontroller 52 reverts to an idle mode 64 for less consumption. If a preamble signal is detected in step 63, the next group of steps 62 are steps for the fine detection with the following applications:

choice of the synchronous mode for a narrow channel bandwidth on the filter 58, activation of AFC module 46 (cf. FIG. 3), AFC algorithm, and last step 66: useful data frame detection.

The FIG. 5 shows an example of the AFC flowchart as implemented regarding FIG. 4 for the correction activations. The AFC correction is preferably in action (step B) when a radio frequency is received. A delay called "Start AFC delay" 70 is applied before AFC measurement. In a step 71, the AFC module reads the register memory. The next step 73 is a test panel depending on the type of detection to be implemented, a coarse detection or a fine detection, as determined by the microcontroller.

In the case of a coarse detection, another test panel 74 is joined to ask whether the frequency offset is higher or lower than a threshold. This threshold allows to not change the frequency if the frequency offset is low—for example +/−2 kHz. Below this value there is no correction. The choise of the threshold is a practical value. Below 2 kHz, the demodulation is operative and above errors can occur; starting from this test:

If the answer is YES, a frequency offset is calculated for coarse detection (step 75), and a new frequency is programmed (step 78);

If the answer is NO, no frequency offset is detected nor calculated: no programming of a new frequency occurred and the end of this algorithm is reached (step 72).

In the case of a fine correction, a fine offset is calculated (step 76) and a new frequency is programmed (step 78). The "End AFC delay" 72 is a delay applied after programming frequency to allow the recovering of the data.

As an example of practical results for the hereafter frequency ranges, it follows:

Frequency range with AFC correction: +/−30 kHz

Frequency range without AFC correction nor activation with 40 kHz filter: about +/−5 kHz The present invention is intended to be used for the Radio Frequency (RF) band, but is not limited to this RF band. The present invention is not limited neither to embodiments with programmable filters; fixed filter can be used. The present invention is not limited to frequency synthesis made by PLL/synthesizer but other ways could be used, for example: crystal (VCXO=voltage control crystal oscillator), or frequency offset caused by a smart demodulator with a modification of the threshold of detection and modification of its threshold element.

The invention claimed is:

1. An automatic frequency offset compensation method to compensate a frequency offset of a carrier frequency signal modulated by data between emitter and receiver of equipments, the method comprising carrying out a demodulation to obtain I (In Phase) and Q (Quadrature) parameters after signal digitalization and channel filtering, calculating the frequency offset from the I and Q parameters between received and local frequency of the equipment, and synthesizing corrected frequency based on the calculated offset, the method further comprising:

initially performing the channel filtering with a wide bandwidth;

performing a first frequency compensation based on a preamble of a frame by performing a coarse frequency offset evaluation by automatic frequency control, calculating a first frequency offset based on the coarse frequency offset evaluation, and programming a phase-locked loop/synthesizer based on the first frequency offset;

performing a coarse detection of the preamble;

performing a second frequency compensation based on the preamble by performing a fine frequency offset evaluation by automatic frequency control, calculating a second frequency offset based on the fine frequency offset evaluation, and programming the phase-locked loop/synthesizer based on the second frequency offset;

deducing the corrected frequency based on the calculated offset;

performing the channel filtering with a narrow bandwidth centered on the corrected frequency; and performing a fine detection of data of the frame.

2. The automatic frequency offset compensation method according to claim 1, wherein the coarse detection is repeated at least twice.

3. The automatic frequency offset compensation method according to claim 1, further comprising using an asynchronous mode for the coarse detection.

4. The automatic frequency offset compensation method according to claim 1, further comprising using a asynchronous mode for the fine detection.

5. The automatic frequency offset compensation method according to claim 1, further comprising determining the frequency offset calculation from a type of detection to be implemented, the coarse detection or the fine detection.

6. The automatic frequency offset compensation method according to claim 5, wherein, in case of the coarse detection, the frequency offset is compared to a threshold and a frequency is calculated for the coarse detection with programming of a new frequency.

7. The automatic frequency offset compensation method according to claim 5, wherein, in case of the fine detection, the fine frequency offset is calculated and a new frequency is programmed.

8. An automatic frequency offset compensation device comprising:

a mixer to downconvert a received frequency to a lower frequency;

a frequency synthesizer to supply a local frequency to the mixer;

a channel filter to filter the lower frequency with a programmable bandwidth;

an automatic frequency control unit to compare the received frequency with the local frequency; and a digital unit, to program the channel filter to perform filtering with a wide bandwidth;

perform a first frequency compensation based on a preamble of a frame by performing a coarse frequency offset evaluation using the automatic frequency control unit, calculating a first frequency offset based on the coarse frequency offset evaluation, and programming the frequency synthesizer based on the first frequency offset;

perform a coarse detection of the preamble;

perform a second frequency compensation based on the preamble by performing a fine frequency offset evaluation using the automatic frequency control unit, calculating a second frequency offset based on the fine frequency offset evaluation, and programming the frequency synthesizer based on the second frequency offset;

deducing a corrected frequency based on the calculated offset;

program the channel filter to filter with a narrow bandwidth centered on the corrected frequency; and perform a fine detection of data of the frame.

9. The automatic frequency offset compensation device according to claim 8, wherein the frequency synthesizer is a Phase Locked Loop (PLL) synthesizer.

10. The automatic frequency offset compensation device according to claim 8, wherein a register stores the output information of an I/Q demodulator to be used by the automatic frequency control unit.

11. The automatic frequency offset compensation device according to claim 8, wherein the digital unit is a microcontroller that controls the automatic frequency control unit, the channel filter, an I/Q demodulator, and the frequency synthesizer.

12. The automatic frequency offset compensation device according to claim 8, wherein an Analog to Digital converter converts the filtered frequency before processing by the digital unit.

13. The automatic frequency offset compensation device according to claim 12, wherein the Analog to Digital converter is a Sigma Delta Analog to Digital converter.

14. The automatic frequency offset compensation device according to claim 8, further comprising a bit synchronizer that implements a synchronous mode.

15. The automatic frequency offset compensation device according to claim 11, wherein the microcontroller is a 6 bit microcontroller.

* * * * *

UNITED STATES PATENT AND TRADEMARK OFFICE
CERTIFICATE OF CORRECTION

| | | |
|---|---|---|
| PATENT NO. | : 8,532,234 B2 | Page 1 of 1 |
| APPLICATION NO. | : 13/004276 | |
| DATED | : September 10, 2013 | |
| INVENTOR(S) | : Maleysson et al. | |

It is certified that error appears in the above-identified patent and that said Letters Patent is hereby corrected as shown below:

On the title page item [73], delete "Coronis SAS, Perols" and insert therefor: -- Elster, Lognes --.

Signed and Sealed this
Fifth Day of April, 2016

Michelle K. Lee
*Director of the United States Patent and Trademark Office*